US008564361B2

(12) United States Patent
Tanaka et al.

(10) Patent No.: US 8,564,361 B2
(45) Date of Patent: Oct. 22, 2013

(54) SEMICONDUCTOR DEVICE AND METHOD OF CONTROLLING THE SAME

(71) Applicant: Elpida Memory, Inc., Tokyo (JP)

(72) Inventors: Hitoshi Tanaka, Tokyo (JP); Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/799,109

(22) Filed: Mar. 13, 2013

(65) Prior Publication Data

US 2013/0194035 A1 Aug. 1, 2013

Related U.S. Application Data

(63) Continuation of application No. 13/283,882, filed on Oct. 28, 2011, now Pat. No. 8,446,214.

(30) Foreign Application Priority Data

Nov. 5, 2010 (JP) ................................ 2010-248438

(51) Int. Cl.
*G05F 1/10* (2006.01)
*G05F 3/02* (2006.01)

(52) U.S. Cl.
USPC ............................ 327/540; 327/538; 327/541

(58) Field of Classification Search
USPC ......................................... 327/538, 540, 333
See application file for complete search history.

(56) References Cited

U.S. PATENT DOCUMENTS

| | | | | |
|---|---|---|---|---|
| 5,451,897 A | | 9/1995 | Komuro | |
| 5,877,647 A | * | 3/1999 | Vajapey et al. | 327/391 |
| 6,320,810 B1 | | 11/2001 | Kono et al. | |
| 7,511,541 B2 | | 3/2009 | Chatal et al. | |
| 7,564,299 B2 | | 7/2009 | Shor et al. | |
| 8,446,214 B2 | * | 5/2013 | Tanaka et al. | 327/540 |

FOREIGN PATENT DOCUMENTS

| | | |
|---|---|---|
| JP | 05-062481 A | 3/1993 |
| JP | 11-096758 A | 4/1999 |
| JP | 2001-084765 A | 3/2001 |

OTHER PUBLICATIONS

Notice of Allowance issued Jan. 28, 2013 in U.S. Appl. No. 13/283,882.

* cited by examiner

*Primary Examiner* — Hai L Nguyen
(74) *Attorney, Agent, or Firm* — Sughrue Mion, PLLC

(57) ABSTRACT

A semiconductor device includes a regulator including an operational amplifier configured of a current mirror and generating the second voltage $V_2$ from a first voltage $V_1$; and a control circuit that generates the current control signal OVDR, makes a current that is flowed by the current mirror increase by a first transition of the current control signal OVDR, and makes the current that is flowed by the current mirror decrease by a second transition of the current control signal OVDR. The control circuit includes a slew-rate processing unit that makes a second slew rate of the current control signal OVDR related to the second transition be smaller than a first slew rate of the current control signal OVDR related to the first transition.

20 Claims, 14 Drawing Sheets

SEMICONDUCTOR DEVICE AND METHOD OF CONTROLLING THE SAME

CROSS-REFERENCE TO RELATED APPLICATIONS

This application is a Continuation Application of U.S. application Ser. No. 13/283,882 filed Nov. 4, 2011, which claims priority from Japanese Patent Application No. 2010-248438 filed on Nov. 5, 2010, the disclosures of which are incorporated herein by reference in their entirety.

BACKGROUND OF THE INVENTION

1. Field of the Invention

The present invention relates to a semiconductor device and a method of controlling the same, and particularly relates to a semiconductor device that generates an internal voltage from an external power supply voltage and a method of controlling the same.

2. Description of Related Art

In some of the semiconductor devices such as a DRAM (Dynamic Random Access Memory), two regulators are employed in an internal voltage generating circuit which generates an internal voltage from an external power supply voltage. One of them is a stand-by regulator whose current supply capability is small and a power consumption is also small, and another one of them is an active regulator whose current supply capability and power consumption are both large. Such a configuration is employed primarily from a viewpoint of reducing the power consumption, where the stand-by regulator is configured to operate constantly during when a power of the semiconductor device is on, whereas the active regulator is configured to operate only during an active period.

A regulator is generally configured by including an operational amplifier and a driver transistor. An activation of the active regulator is performed by turning on a current supplying transistor provided in a common source of the operational amplifier. When the current supplying transistor is turned on, a current flows in a current mirror circuit in the operational amplifier and thereby the driver transistor turns on, and the internal voltage begins to be generated. Japanese Patent Application Laid-open Nos. H05-62481, 2001-84765 and H11-96758 disclose examples of a voltage generating circuit that performs such an activation control.

In the voltage generating circuit described in Japanese Patent Application Laid-open No. H05-62481, two current supplying transistors are provided in parallel, and one of the current supplying transistors is configured to turn on only for a predetermined period of time upon a switchover from a stand-by to being active. By employing such a configuration, as is described in paragraph [0007] of Japanese Patent Application Laid-open No. H05-62481, it becomes possible to suppress a drop in the internal voltage just after the switchover as possible, and also to suppress an overshoot in the internal voltage due to a reaction after the drop.

However, in the aforementioned configuration, there is a problem that another overshoot (in a case where the driver transistor is an N-type channel MOS transistor) or an undershoot (in a case where the driver transistor is a P-type channel MOS transistor) occurs in the internal voltage just after the one of the current supplying transistors is turned off. This is because a gate potential of the driver transistor temporarily rises due to the current supplying transistor being abruptly turned off, and a suppression of such an overshoot or an undershoot is being required.

SUMMARY

In one embodiment, there is provided a semiconductor device that includes: an internal voltage generating circuit supplied with a first voltage to generate a second voltage and including an operational amplifier having a current mirror circuit; and a control circuit that generates a current control signal, wherein the current mirror circuit increases an operating current thereof in response to a first transition of the current control signal and decreases the operating current in response to a second transition of the current control signal, and the control circuit includes a slew-rate processing unit that controls a slew-rate of the current control signal so that a first slew rate of the current control signal related to the first transition is greater than a second slew rate of the current control signal related to the second transition.

In another embodiment, there is provided a semiconductor device that includes: an internal voltage generating circuit including a differential amplifier having first and second input nodes and an output node, first and second current supplying transistors connected in parallel to the differential amplifier to supply an operating current to the differential amplifier, and a driver transistor having a control electrode and first and second controlled electrodes, the first controlled electrode of the driver transistor being supplied with a first voltage, the second controlled electrode of the driver transistor being connected to the second input node of the differential amplifier, the control electrode of the driver transistor being connected to the output node of the differential amplifier, the first input node of the differential amplifier being supplied with a target voltage of a second voltage to be generated, thereby the second voltage is output from the second controlled electrode of the driver transistor; and a control circuit that generates an current control signal based on an active signal indicating an activate period of the internal voltage generating circuit, the current control signal being activated for a predetermined period in response to a start of the activate period, wherein the active signal is supplied to a control electrode of the first current supplying transistor, the current control signal is supplied to a control electrode of the second current supplying transistor, and the control circuit includes a slew-rate processing unit that makes a slew rate of the current control signal upon an inactivation thereof be smaller than a slew rate of the active signal upon an activation or an inactivation thereof.

In still another embodiment, there is provided a method of controlling a semiconductor device that includes: providing the semiconductor device comprising an internal voltage generating circuit including an operational amplifier having a current mirror circuit, the internal voltage generating circuit receiving a first voltage to generate a second voltage; increasing an operating current flowing to the current mirror circuit by activating a current control signal at a first slew rate; and decreasing the operating current flowing to the current mirror circuit by inactivating the current control signal at a second slew rate, wherein the second slew rate is smaller than the first slew rate.

DETAILED DESCRIPTION OF THE EMBODIMENTS

A representative example of the technical concept of the present invention for solving the events will be described below. It will be understood that what is claimed by the present invention is not limited to such a technical concept and is set forth in the claims of the present invention. That is, a technical concept of the present invention is as follows: In regards to a current to be flowed in a current mirror of an operational amplifier included in a first internal voltage generating circuit that generates a second voltage from a first voltage, the present invention makes a slew rate upon decreasing the current be smaller than a slew rate upon increasing the current. More specifically, the first internal voltage generating circuit is a circuit that is activated responsive to an active signal, and the first internal voltage generating circuit makes slew rate upon an inactivation of an current control signal which is activated for a predetermined period of time in response to the activation of the active signal be smaller than its slew rate upon the activation. Due to this, since a temporal rise in an output voltage of the operational amplifier upon the current flowing in the current mirror decreasing by the inactivation of the current control signal can be suppressed, the overshoot or the undershoot can be suppressed.

Figure 1:
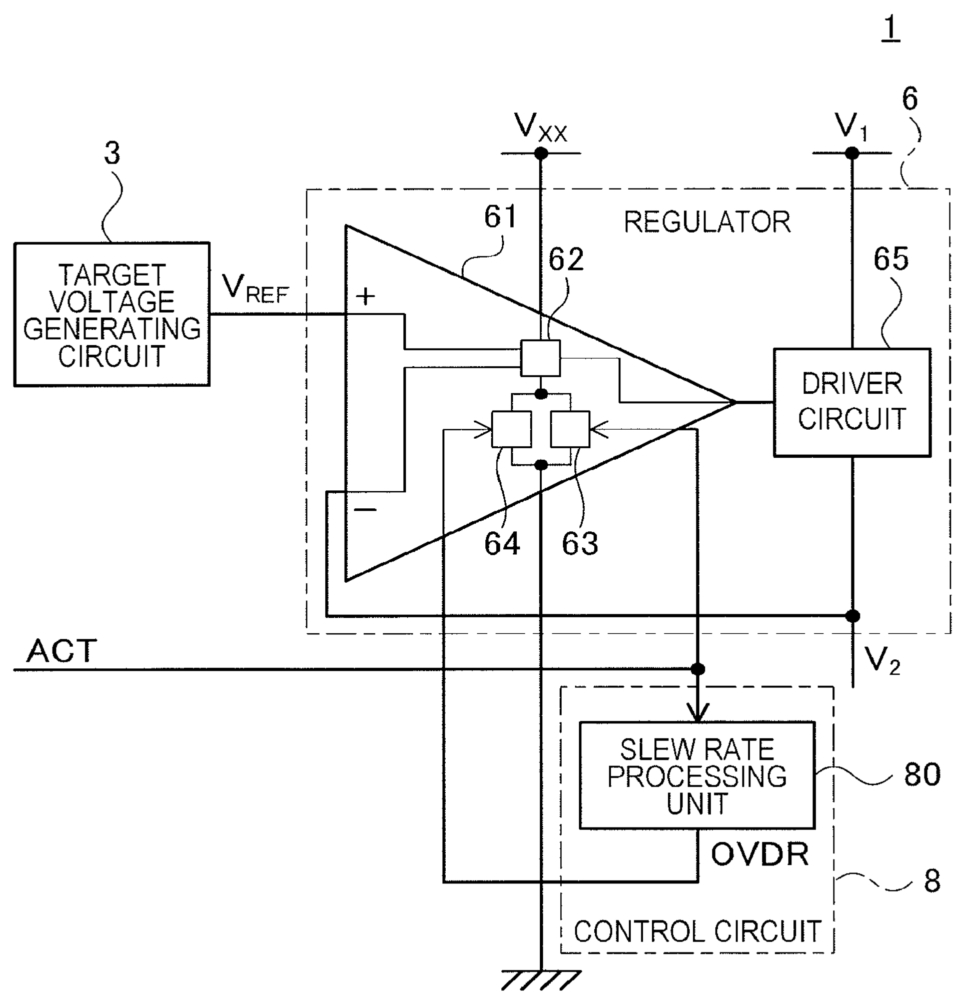
FIG. 1 is a schematic diagram for explaining a principle of the present invention.

Referring now to FIG. 1, a semiconductor device 1 of the present invention is provided with a regulator 6 (first internal voltage generating circuit) that generates a second voltage $V_2$ from a first voltage $V_1$ ($V_2<V_1$). The first voltage $V_1$ is typically an external voltage. Although not shown, the second voltage $V_2$ is supplied to a predetermined load in the semiconductor device 1 via an internal power supply line.

The regulator 6 includes an operational amplifier 61 and a driver circuit 65. The operational amplifier 61 includes a differential amplifier 62 configured of a current mirror, and a target voltage $V_{REF}$ of the second voltage $V_2$ is supplied to one of input terminals of the differential amplifier 62 from a target voltage generating circuit 3. The driver circuit 65 is a driver transistor, and the first voltage $V_1$ is supplied to one of its controlled terminals, and a control terminal and another one of the controlled terminals are connected to an output terminal of the differential amplifier 62 and another one of the input terminals of the differential amplifier 62, respectively. The driver circuit 65 may be an N-type channel, or may be a P-type channel. An output voltage $V_2$ of the regulator 6 is taken out from the other of the controlled terminals of the driver circuit 65. According to the aforementioned configuration, the operational amplifier 61 performs an on/off control of the driver circuit 65 such that the voltage $V_2$ of the other of the controlled terminals of the driver circuit 65 equals the target voltage $V_{REF}$. Consequently, the output voltage $V_2$ of the regulator 6 becomes equal to the target voltage $V_{REF}$. Note that, “on” herein refers to being electrically conductive, and “off” herein refers to being electrically nonconductive. These apply herein to the present specification.

The on/off control as aforementioned by the operational amplifier 61 is not performed constantly; it is performed only in a case where an active signal ACT is in an active state. The active signal ACT is a signal indicating an active period of the regulator 6, i.e. a period during when a generating operation of the second voltage $V_2$ by the regulator 6 is required, and is generated outside the regulator 6. A switchover of the operational state of the operational amplifier 61 by the active signal ACT is performed by using first and second current supplying transistors 63, 64 provided in the operational amplifier 61.

The first and second current supplying transistors 63, 64 are transistors that supply a current to the differential amplifier 62, and are provided in parallel between the differential amplifier 62 and a ground potential. When one or both of the first and second current supplying transistors 63, 64 are turned on, the current flows in the differential amplifier 62, and the aforementioned on/off control by the operational amplifier 61 is performed.

The active signal ACT is input to a control terminal of the first current supplying transistor 63. Consequently, the first current supplying transistor 63 is constantly turned on during the active period of the regulator 6, and thereby the output voltage $V_2$ of the regulator 6 is maintained at the target voltage $V_{REF}$.

On the other hand, a current control signal OVDR from a control circuit 8 is input to a control terminal of the second current supplying transistor 64. The current control signal OVDR is a signal that is activated for a predetermined period in response to a start of the active period of the regulator 6. Consequently, the second current supplying transistor 64 is temporarily turned on at the beginning of the active period of the regulator 6. While the second current supplying transistor 64 is turned on, since the amount of the current flowing in the differential amplifier 62 is increased by a corresponding amount, it becomes possible to suppress a temporal drop in the second voltage $V_2$ just after the activation of the active signal ACT. Further, a temporal rise (overshoot) in the second voltage $V_2$ due to a reaction after the drop can also be suppressed. According to these, an effect can be achieved in which a time (setting time) after the activation of the regulator 6 until the second voltage $V_2$ comes to be generated stably can be shortened. Further, in assuming that the second current supplying transistor 64 had continuously been kept on during the activation period of the regulator 6, a problem that a power consumption of a chip as a whole becomes large would occur, however, by limiting the period of the turn-on to be within the predetermined period during the switchover from the standby to being activated, such an increase can be suppressed.

The control circuit 8 generates the current control signal OVDR based on the active signal ACT. Specifically, the control circuit 8 activates the current control signal OVDR at an activating timing of the active signal (first transition), and after a certain period of time has elapsed, deactivates the current control signal OVDR (second transition).

The feature of the present invention is that the control circuit 8 includes a slew rate processing unit 80 that processes a slew rate (amount of change per a given time) of the current control signal OVDR upon its inactivation (second transition). The slew rate processing unit 80 makes a slew rate (second slew rate) of a current control signal OVDR related to the inactivation (second transition) to be smaller than a slew rate (first slew rate) of a current control signal OVDR related to the activation (first transition). From a different point of view, it may alternatively be said that the slew rate processing unit 80 makes the slew rate of the current control signal OVDR upon its inactivation (second slew rate) be smaller compared to the slew rate of the active signal ACT upon its activation or inactivation.

When the second current supplying transistor 64 is abruptly turned off, a potential of the control terminal of the driver circuit 65 rises temporarily. Due to this, an overshoot (in the case where the driver circuit 65 is the N-type channel) or an undershoot (in the case where the driver circuit 65 is the P-type channel) is exhibited in the second voltage $V_2$. In the present invention, since the temporal rise in the potential of the control terminal of the driver circuit 65 is suppressed by the aforementioned processing of the slew rate processing unit 80, the occurrence of such overshoot or undershoot is suppressed.

Preferred embodiments of the present invention will be explained below in detail with reference to the accompanying drawings.

Figure 2:
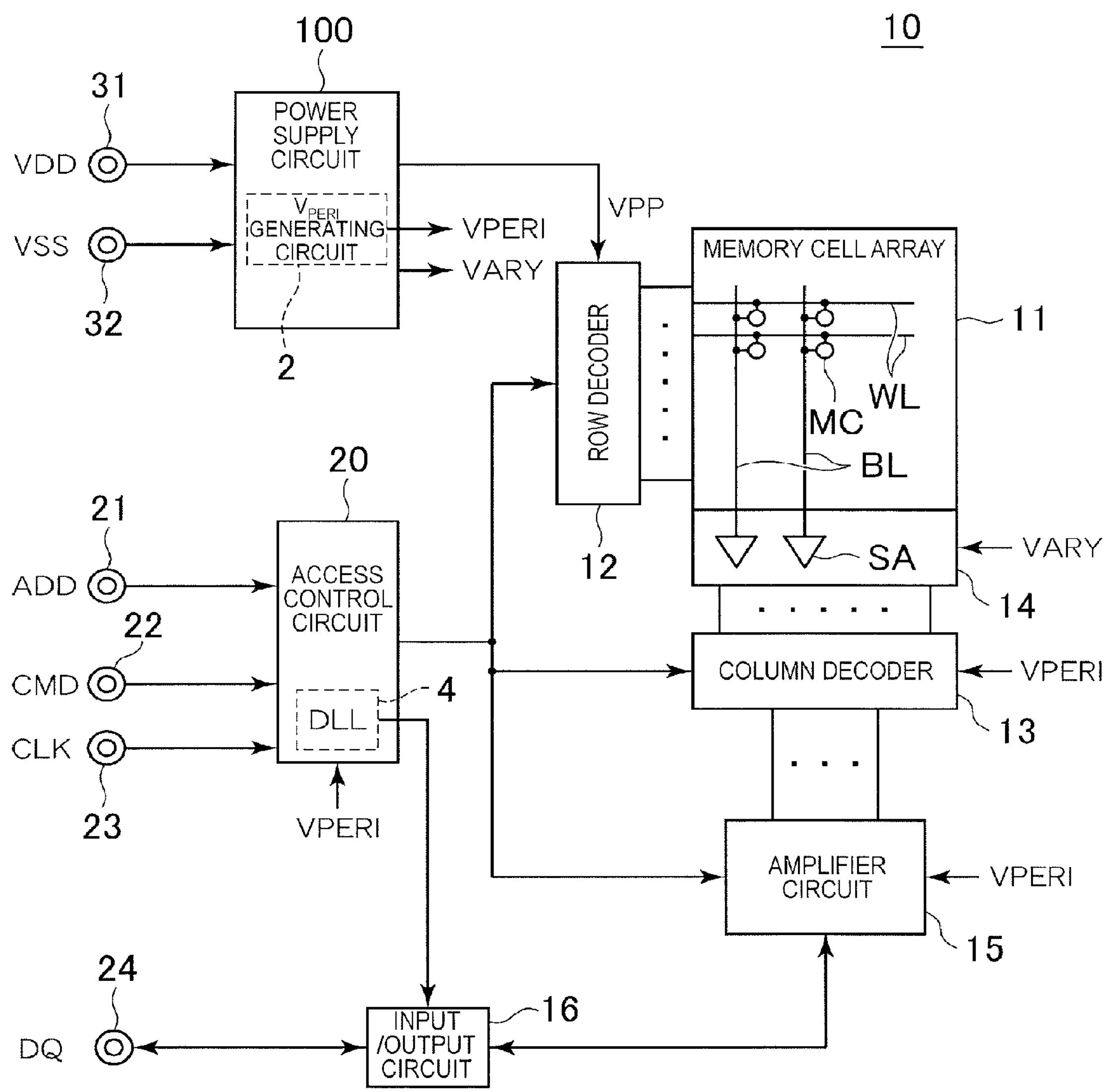
FIG. 2 is a block diagram showing a configuration of the semiconductor device according to a preferred first embodiment of the present invention.

Turning to FIG. 2, the semiconductor device 1 of the present embodiment is a DRAM, and includes a memory cell array 11 as shown in FIG. 2. In the memory cell array 11, a plurality of word lines WL and a plurality of bit lines BL that intersect one another are provided, and memory cells MC are arranged at interunits thereof. A selection of the word lines WL is performed by a row decoder 12, and a selection of the bit lines BL is performed by a column decoder 13. Each bit line BL is connected to a corresponding sense amplifier SA in a sense circuit 14, and the bit line BL selected by the column decoder 13 is connected to an amplifier circuit 15 via the sense amplifier SA.

Operations of the row decoder 12 and the column decoder 13 are controlled by an access control circuit 20. The access control circuit 20 receives an address signal ADD and a command signal CMD supplied from outside via an address terminal 21 and a command terminal 22, respectively, and controls the row decoder 12 and the column decoder 13 based on these address signal ADD and command signal CMD. Further, the access control circuit 20 also controls an operation of the amplifier circuit 15.

Specifically, in a case where the command signal CMD indicates an active operation, the address signal ADD is supplied to the row decoder 12. In response to this, the row decoder 12 selects a word line WL indicated by the address signal ADD, and thereby corresponding memory cells MC are respectively connected to the bit lines BL. Further, in a case where the command signal CMD indicates a read operation or a write operation, the address signal ADD is supplied to the column decoder 13. In response to this, the column decoder 13 connects a bit line BL indicated by the address signal ADD to the amplifier circuit 15. Consequently, in the case where the command signal CMD indicates the read operation, read data DQ read from the memory cell array 11 via the sense amplifiers SA is output to outside from a data terminal 24 via the amplifier circuit 15 and an input/output circuit 16. On the other hand, in the case where the command signal CMD indicates the write operation, write data DQ supplied from outside via the data terminal 24 is written into the memory cells MC via the input/output circuit 16, the amplifier circuit 15, and the sense amplifiers SA.

The aforementioned respective circuit blocks use predetermined internal voltages as their operation power source. These internal voltages are generated by a power supply circuit 100 shown in FIG. 2. The power supply circuit 100 receives an external potential $V_{DD}$ and a ground potential $V_{SS}$ supplied respectively via power supply terminals 31, 32, and generates internal voltages $V_{PP}$, $V_{PERI}$, $V_{ARY}$, etc. based on the potentials. Note that, in this specification, $V_{DD}$, $V_{PP}$, $V_{PERI}$, and $V_{ARY}$ indicate levels of the potentials, and in addition, also indicate potential differences (voltages) relative to the ground potential $V_{SS}$. For example, "$V_{DD}$" refers to the potential level itself of the external potential $V_{DD}$, and also indicates the potential difference (voltage) relative to the ground potential $V_{SS}$. The same applies to $V_{PP}$, $V_{PERI}$, and $V_{ARY}$. In the present embodiment, $V_{PP}>V_{DD}>V_{PERI}\approx V_{ARY}$.

The internal voltage $V_{PP}$ is a voltage used in the row decoder 12. The row decoder 12 drives the word line WL selected based on the address signal ADD at the $V_{PP}$ level, and thereby makes cell transistors included in the memory cells MC turn on. The internal voltage $V_{ARY}$ is a voltage used in the sense circuit 14. The sense circuit 14, when activated, amplifies read data that has been read by driving one of a bit line pair at the $V_{ARY}$ level and another one thereof at the $V_{SS}$ level. The internal voltage $V_{PERI}$ is used as an operational voltage for most of peripheral circuits such as the access control circuit 20. In the circuits that operate with the internal voltage $V_{PERI}$ as the operational power supply, a DLL circuit 4 that generates an internal clock for synchronizing an output timing of data by the input/output circuit 16 with an external clock input from a clock terminal 23 is included. By using the internal voltage $V_{PERI}$ having a lower voltage than $V_{DD}$ as the operational voltage of the peripheral circuits, a reduction of the power consumption is realized.

Figure 3:
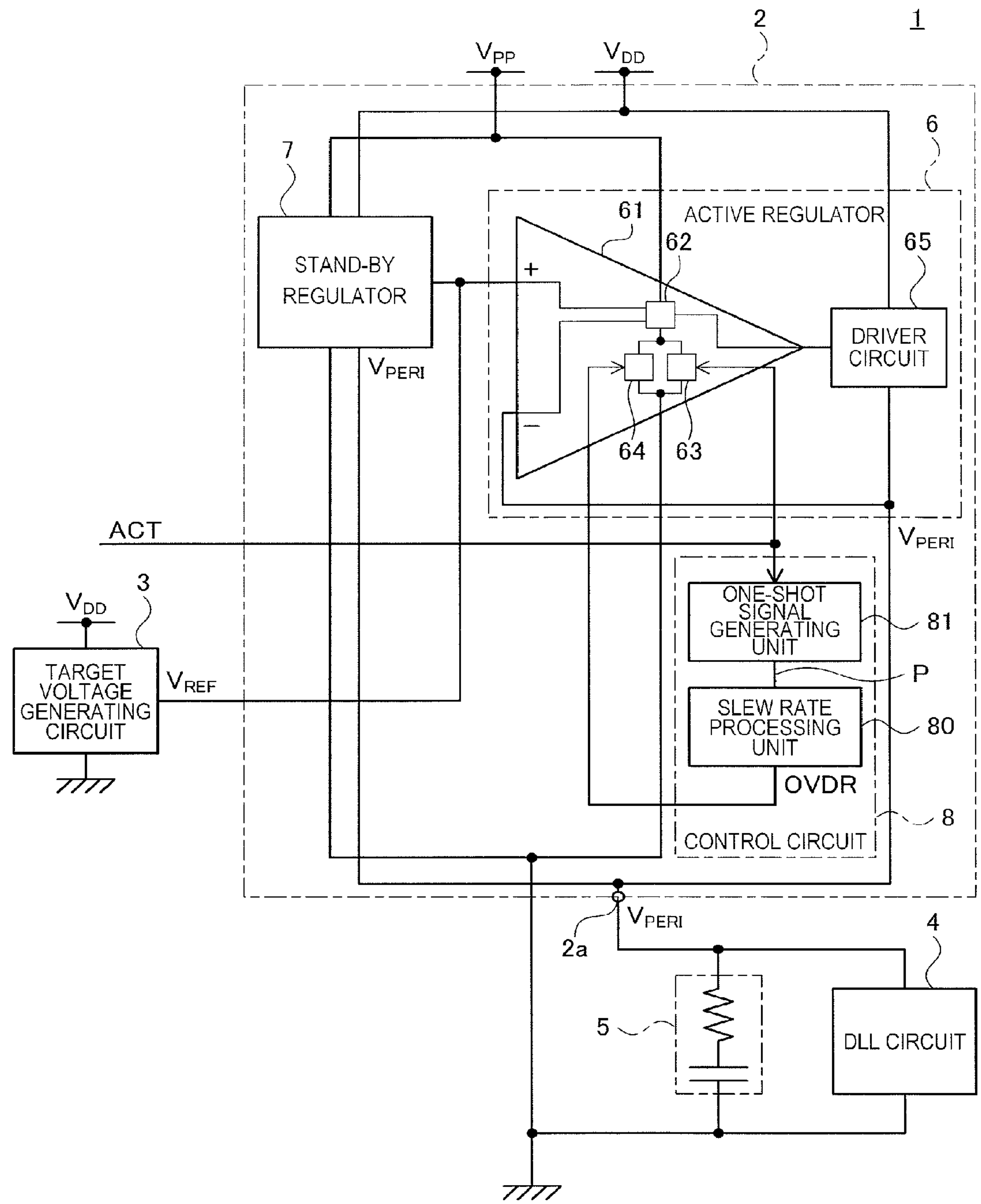
FIG. 3 is a block diagram showing a $V_{PERI}$ generating circuit that generates the internal voltage $V_{PERI}$ extracted from among the circuit blocks included in the power supply circuit and also describes the target voltage generating circuit, the DLL circuit, and a phase compensating circuit.

Aside from the $V_{PERI}$ generating circuit 2, FIG. 3 also describes the target voltage generating circuit 3, the DLL circuit 4, and a phase compensating circuit 5. Prior to an explanation on the $V_{PERI}$ generating circuit 2, these circuits will be explained.

The target voltage generating circuit 3 is a circuit that generates the target voltage $V_{REF}$ of the power supply voltage $V_{PERI}$, and is herein a constant voltage generating circuit. Specifically, the target voltage generating circuit 3 may be configured by a circuit that takes out the target voltage $V_{REF}$ by dividing the power supply voltage $V_{DD}$ using a resistance. The generation scheme of the target voltage $V_{REF}$ by a resistance division is called a voltage generating scheme. Meanwhile, although a scheme called a current generating scheme may be employed for the generation of the target voltage $V_{REF}$, this feature will be explained in detail in a second embodiment described later.

The DLL circuit 4 denotes an example of the peripheral circuits that operate with the power supply voltage $V_{PERI}$ as the operational power source. The DLL circuit 4 is a circuit that generates the internal clock only when an output of the read data is performed, and is in a sleep state in cases where the output of the read data is not performed. Consequently, the current consumption of the DLL circuit 4 greatly varies depending on whether the output of the read data is performed or not.

The phase compensating circuit 5 is a serial circuit of a resistive element and a capacity element, and is connected in parallel with the DLL circuit 4 between a $V_{PERI}$ output terminal 2*a* (described later) and a ground terminal. The phase compensating circuit 5 is provided to stabilize a waveform of the power supply voltage $V_{PERI}$.

An explanation of the $V_{PERI}$ generating circuit 2 will be given below. As shown in FIG. 3, the $V_{PERI}$ generating circuit 2 includes an active regulator 6 (first internal voltage generating circuit), a stand-by regulator 7 (second internal voltage generating circuit), and the control circuit 8.

The regulators 6, 7 generate the power supply voltages $V_{PERI}$ for the peripheral circuits respectively from the power supply potential $V_{DD}$, and output the same to the $V_{PERI}$ output terminal 2*a*. The $V_{PERI}$ output terminal 2*a* is connected to a power supply terminal of the DLL circuit 4, and the power supply voltage $V_{PERI}$ is supplied to the DLL circuit 4 thereby. The regulator 6 generates the power supply voltage $V_{PERI}$ in response to the active signal ACT only when needed as described above, while on the other hand, the regulator 7 constantly generates the power supply voltage $V_{PERI}$ during when at least the power of the semiconductor device 1 is on.

The active signal ACT is a signal that is activated e.g. when the output of the read data is performed. As described above, the DLL circuit 4 generates the internal clock only when the output of the read data is performed, and the current consumption of the DLL circuit 4 increases at such an occasion. The active signal ACT is activated when the output of the read data is performed so that this increased current consumption can sufficiently be dealt with, and makes the current supply capability of the $V_{PERI}$ generating circuit 2 be increased. That is, in the case where the active signal ACT is in the active state, since both of the regulators 6, 7 generate the power supply voltage $V_{PERI}$, the current supply capability of the $V_{PERI}$ generating circuit 2 is increased compared to a case where only the regulator 7 generates the power supply voltage $V_{PERI}$.

Next, as shown in FIG. 3, the regulator 6 includes the operational amplifier 61 and the driver circuit 65. The operational amplifier 61 includes the differential amplifier 62 configured of the current mirror, and the target voltage $V_{REF}$ of the power supply voltage $V_{PERI}$ is supplied to one of input terminals of the differential amplifier 62 from the target voltage generating circuit 3. Further, the first and second current supplying transistors 63, 64 are provided in parallel between the differential amplifier 62 and the ground potential. The driver circuit 65 is a driver transistor, and the power supply voltage $V_{PERI}$ is supplied to the one of its controlled terminals, and the control terminal and the other of the controlled terminals are connected to the output terminal of the differential amplifier 62 and the other of the input terminals of the differential amplifier 62, respectively.

Figure 4:
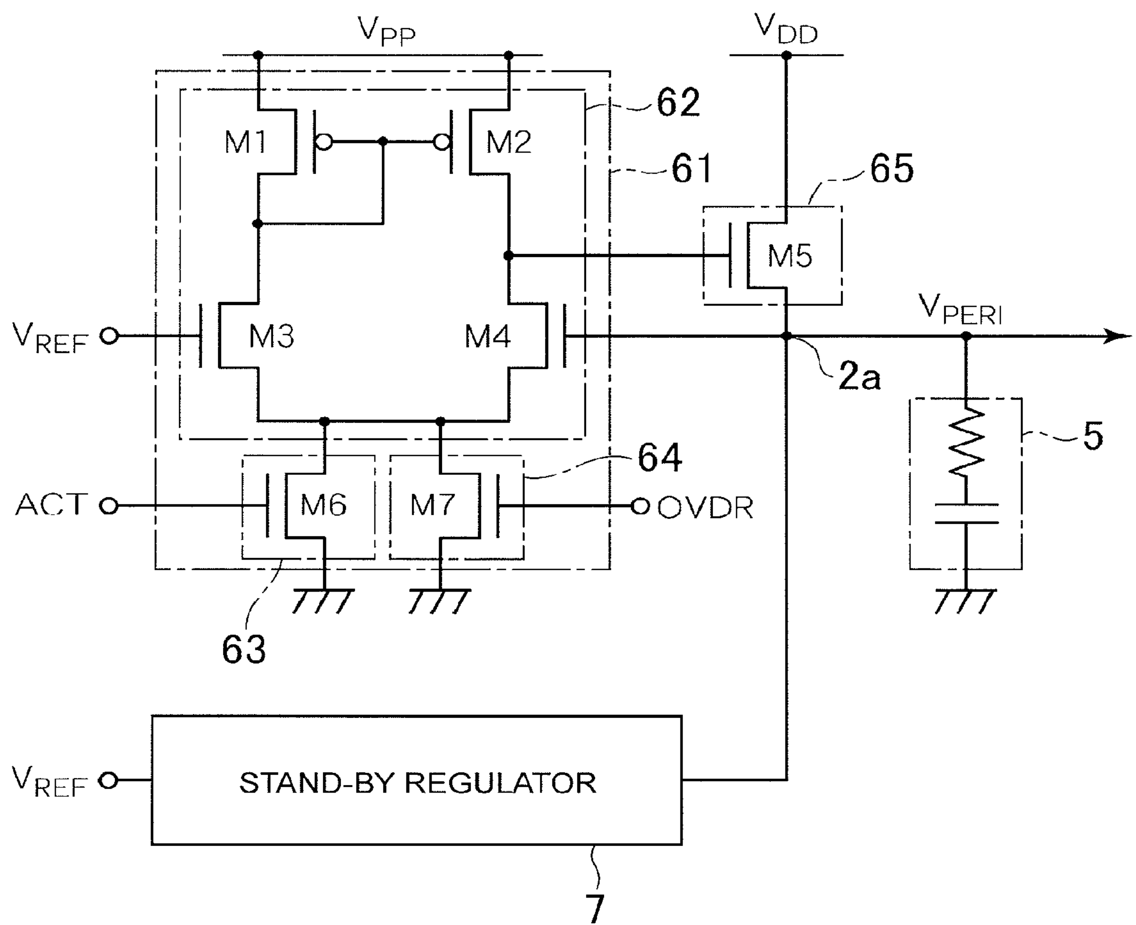
FIG. 4 is a circuit diagram specifically showing an internal configuration of the operational amplifier and the driver circuit according to the preferred first embodiment of the present invention.

Turning to FIG. 4, the differential amplifier 62 includes P-type channel transistors M1, M2 configuring a current mirror, an N-type channel transistor M3 having a drain connected to a drain of the transistor M1, and an N-type channel transistor M4 having a drain connected to a drain of the transistor M2. The driver circuit 65 is configured of an N-type channel transistor M5.

The power supply voltage $V_{PP}$ ($>V_{DD}$) is supplied to sources of the transistors M1, M2, and the target voltage $V_{REF}$ is supplied to a gate of the transistor M3 (the one of the input terminals of the differential amplifier 62). The reason of supplying the power supply voltage $V_{PP}$ higher than the power supply voltage $V_{DD}$ to the sources of the transistors M1, M2 is to prevent the power supply voltage $V_{PERI}$ to be generated from becoming lower than the target voltage $V_{REF}$ due to the variation in the power supply voltage $V_{DD}$. Hereinbelow, a detailed explanation will be given.

In the regulator 6, since the driver circuit 65 is configured of the transistor M5 that is the N-type channel, when assuming that the power supply voltage supplied to the sources of the transistors M1, M2 as $V_{XX}$ ($V_{XX}$ being $V_{PP}$ or $V_{DD}$), the maximum value of the generatable power supply voltage $V_{PERI}$ comes to be $V_{XX}-Vt$. Note that Vt is a threshold voltage of the transistor M5. A difference between this maximum value and the target voltage $V_{REF}$ is $V_{XX}-Vt-V_{REF}$, and in order to maintain the power supply voltage $V_{PERI}$ at the target voltage $V_{REF}$, this difference must be 0 or more. That is, $V_{XX} \geq Vt+V_{REF}$ is necessary to maintain the power supply voltage $V_{PERI}$ at the target voltage $V_{REF}$.

The power supply voltage $V_{DD}$ normally satisfies $V_{DD} \geq Vt+V_{REF}$. However, there is a possibility that the power supply voltage $V_{DD}$ varies due to a variation in the external power supply. etc., and depending on the amount of the variation, $V_{DD} \geq Vt+V_{REF}$ may not be satisfied. Thus, in the present embodiment, the power supply voltage $V_{PP}$ higher than the power supply voltage $V_{DD}$ is supplied to the sources of the transistors M1, M2 so that $V_{XX} \geq Vt+V_{REF}$ can be more certainly satisfied.

Notably, a gate of the transistor M4 (the other of the input terminals of the differential amplifier 62) and a source of the transistor M5 (the one of the controlled terminals of the driver circuit 65) are both connected to the $V_{PERI}$ output terminal 2*a*. The power supply voltage $V_{DD}$ is supplied to a drain of the transistor M5 (the other of the controlled terminals of the driver circuit 65). A drain of the transistor M2 (the output terminal of the differential amplifier 62) and a gate of the transistor M5 (the control terminal of the driver circuit 65) are connected to one another.

Sources of the transistors M3, M4 are connected to one another, and are connected to the ground terminal via N-type channel transistors M6, M7. The transistors M6, M7 are the first and second current supplying transistors 63, 64, respectively, and are connected in parallel between the sources of the transistors M3, M4 (common source) and the ground terminal. The active signal ACT and the current control signal OVDR are respectively input to respective one of gates of the transistors M6, M7. Note that the active signal ACT and the current control signal OVDR are high-active signals.

According to the above configuration, during when the active signal ACT is activated, currents equivalent to one another flow in the transistors M1, M2 configuring the current mirror, and due to this, the potential of the $V_{PERI}$ output terminal 2*a* is maintained at the target voltage $V_{REF}$. To explain in further detail, in a case where the potential of the $V_{PERI}$ output terminal 2*a* becomes lower than the target voltage $V_{REF}$, the current flowing in the transistor M4 decreases, and thereby a common source potential of the transistors M3, M4 decreases. Then, the current of the transistor M3 increases, which induces the current of the transistor M1 to increase. Since the transistors M1, M2 configure the current mirror, the current of the transistor M2 also increases. Due to this, the gate potential of the transistor M5 rises, and the current supplied to the $V_{PERI}$ output terminal 2*a* via the transistor M5 increases. Due to this, the potential of the $V_{PERI}$ output terminal 2*a* shifts to an increasing direction. On the other hand, in a case where the potential of the $V_{PERI}$ output terminal 2*a* becomes larger than the target voltage $V_{REF}$, the current flowing in the transistor M4 increases, and thereby the common source potential of the transistors M3, M4 rises. Then, the current of the transistor M3 decreases, which induces the current of the transistor M1 to decrease. Since the transistors M1, M2 configure the current mirror, the current of the transistor M2 also decreases. Consequently, the gate potential of the transistor M5 drops, and the current supplied to the $V_{PERI}$ output terminal 2*a* via the transistor M5 decreases. Due to this, the potential of the $V_{PERI}$ output terminal 2*a* shifts to a decreasing direction.

When the current control signal OVDR is activated along with the activation of the active signal ACT, the amount of the currents flowing in the transistors M1 to M4 increases. Consequently, the differential amplifier 62 is enabled to operate even faster, and it becomes possible to suppress the temporal drop in the power supply voltage $V_{PERI}$ just after the activation of the active signal ACT. Further, the temporal rise (overshoot) in the power supply voltage $V_{PERI}$ due to the reaction after the drop can also be suppressed.

On the other hand, when the current control signal OVDR is inactivated during when the active signal ACT is in the active state, the amount of the currents flowing in the transistors M1 to M4 decreases by a corresponding amount. Note that, for some period of time, since a gate-source voltages of the transistors M1, M2 are maintained at values at the beginning of the activation of the current control signal OVDR, an imbalance in the currents occurs in the transistors M1, M2 and the transistors M3, M4 during that time, and drain voltages of the transistors M1, M2 rise. The gate potential of the transistor M5 rises accompanying this rise, and just after the start of the inactivation of the current control signal OVDR, it becomes the cause of the significant temporal rise in the power supply voltage $V_{PERI}$ beyond the target voltage $V_{REF}$. In the semiconductor device 1 of the present embodiment, since the slew rate upon the inactivation of the current control signal OVDR is made smaller than usual, it is possible to suppress the overshoot of the power supply voltage $V_{PERI}$ just after when the inactivation of the current control signal OVDR is started. Details thereof will be explained later in detail.

The explanation will return to FIG. 3. As shown in FIG. 3, the control circuit 8 includes the slew rate processing unit 80 and a one-shot signal generating unit 81. The one-shot signal generating unit 81 generates a one-shot signal P that is activated for a predetermined period of time in response to the activation of the active signal ACT. The slew rate processing unit 80 generates a current control signal OVDR having a slew rate upon its inactivation that is smaller than a slew rate upon its activation by making the slew rate of the one-shot signal P upon the inactivation be small. The current control signal OVDR is input to the control terminal of the second current supplying transistor 64 as aforementioned.

Figure 5:
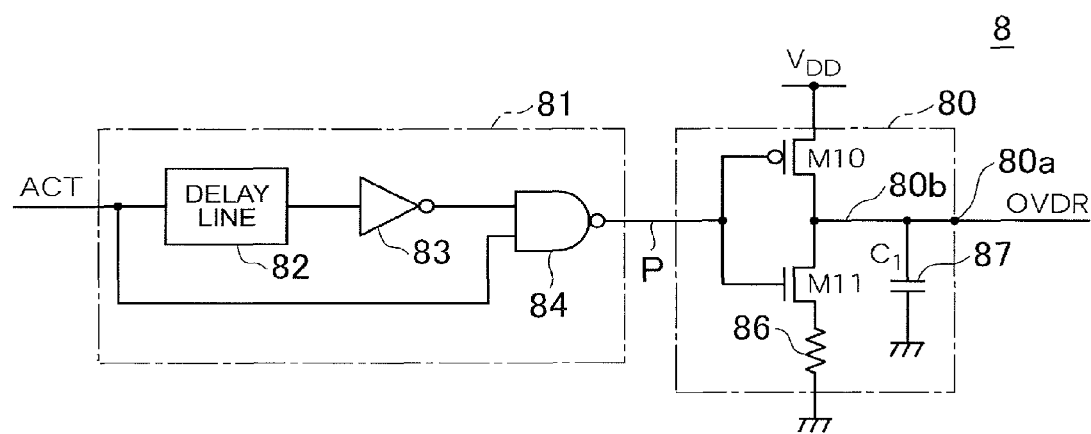
FIG. 5 is a circuit diagram specifically showing an internal configuration of the slew rate processing unit and the one-shot signal generating unit according to the preferred first embodiment of the present invention.

Turning to FIG. 5, the one-shot signal generating unit 81 is configured by including a delay line 82, an inverter 83, and a NAND circuit 84, and the slew rate processing unit 80 is configured by including a complement type transistor configured of a P-type channel transistor M10 and an N-type channel transistor M11, a resistive element 86, and a capacity element 87 (first capacity element). The current control signal OVDR is output from an output terminal 80*a* via an internal line 80*b* of the slew rate processing unit 80. A source terminal of the P-type channel transistor M10 is connected to a first node where the power supply voltage $V_{DD}$ is supplied. A source terminal of the N-type channel transistor M11 is connected to a second node where the ground voltage is supplied via the resistive element 86. A drain terminal of the P-type channel transistor M10 and a drain terminal of the N-type channel transistor M11 are connected to the internal line 80*b*. One of terminals of the capacity element 87 is connected to the internal line 80*b*, and another one of its terminals is connected to the second node.

Figure 6:
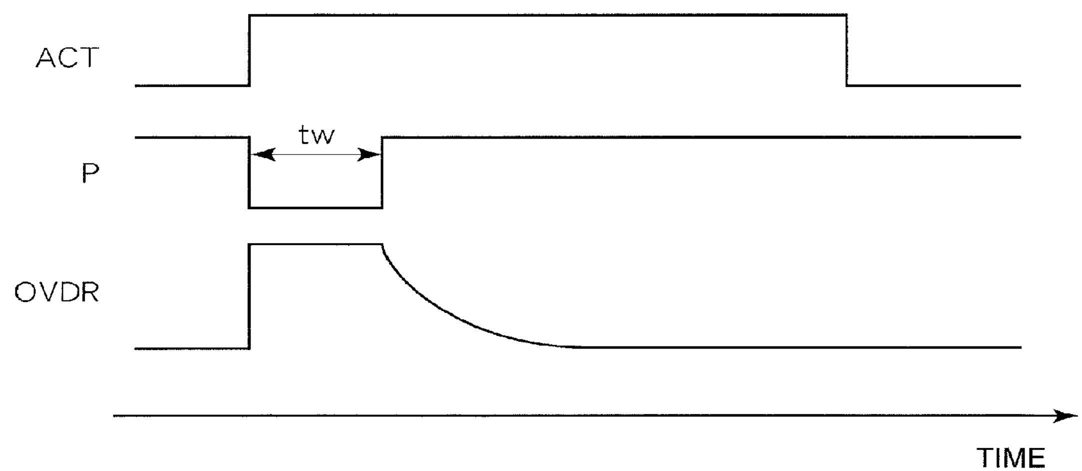
FIG. 6 is a diagram showing changes of the active signal ACT, the one-shot signal P and the current control signal OVDR over time according to the preferred first embodiment of the present invention.

Turning to FIG. 6, the horizontal axis denotes time, and the vertical axis denotes voltage. Hereinbelow, operations of the slew rate processing unit 80 and the one-shot signal generating unit 81 will be explained in detail with reference to this FIG. 6 as well.

As shown in FIG. 5, the active signal ACT is input to the delay line 82. As shown in FIG. 6, the active signal ACT is a high-active signal (signal that becomes high during the activation period). The slew rates of the active signal ACT upon the activation and the inactivation are substantially infinite as shown in FIG. 6. The delay line 82 delays the input active signal ACT for a certain period of time tw, and inputs the same to the inverter 83. The inverter 83 inverts the delayed signal input from the delay line 82, and inputs the same to the NAND circuit 84.

In addition to the aforementioned delayed signal, the active signal ACT that is not delayed is also input to the NAND circuit 84. Consequently, as shown in FIG. 6, the output of the NAND circuit 84 becomes a low-active one-shot signal P which activates at the activating timing of the active signal ACT and inactivates at a timing when the certain period of time tw has elapsed.

The one-shot signal P is input to an input terminal of the complement type transistor configured of the transistors M10, M11. The power supply voltage $V_{DD}$ is supplied to the source of the transistor M10, and the source of the transistor M11 is connected to the ground terminal via the resistive element 86. Further, an output terminal of the complement type transistor is connected to the line 80*b*. Consequently, when the one-shot signal P is low (active state), the power supply voltage $V_{DD}$ is supplied to the line 80*b*, and the potential of the output terminal 80*a* comes to be at the power supply voltage $V_{DD}$. On the other hand, when the one-shot signal P is high (inactive state), the line 80*b* is connected to the ground terminal, and the potential of the output terminal 80*a* comes to be at the ground potential $V_{SS}$.

The capacity element 87 is connected between the line 80*b* and the ground terminal. Consequently, when the one-shot signal P becomes low and the power supply voltage $V_{DD}$ begins to be supplied to the line 80*b*, charging of the capacity element 87 is started. On the other hand, when the one-shot signal P becomes high and the line 80*b* is connected to the ground terminal via the resistive element 86, charges that had been accumulated in the capacity element 87 begins to be discharged. The speed of this discharge is determined by the electric capacitance of the capacity element 87 and the resistance value of the resistive element 86. Note that, it is sufficient that the resistive element 86 and the capacity element 87 are connected in series between two ground terminals and the line 80*b* is connected between these two elements. It goes without saying that an order of the resistive element 86 and the capacity element 87 is not limited. Further, a structure and material of the resistive element 86 is not limited.

By the discharge of the capacity element 87 as aforementioned being performed, the potential of the output terminal 80*a* does not drop to the ground potential $V_{SS}$ abruptly even if the one-shot signal P becomes high. In other words, by the processing of the slew rate processing unit 80, the slew rate of the current control signal OVDR upon the inactivation is changed to be smaller than the usual slew rate (slew rate of the active signal ACT upon its activation or inactivation, or slew rate of the current control signal OVDR upon its activation) as shown in FIG. 6. Accordingly, by the processing of the slew rate processing unit 80, the slew rate of the current control signal OVDR upon the inactivation can be made smaller than usual.

Hereinbelow, an effect of making the slew rate of the current control signal OVDR upon the inactivation smaller than usual will be explained in detail.

Figure 7:
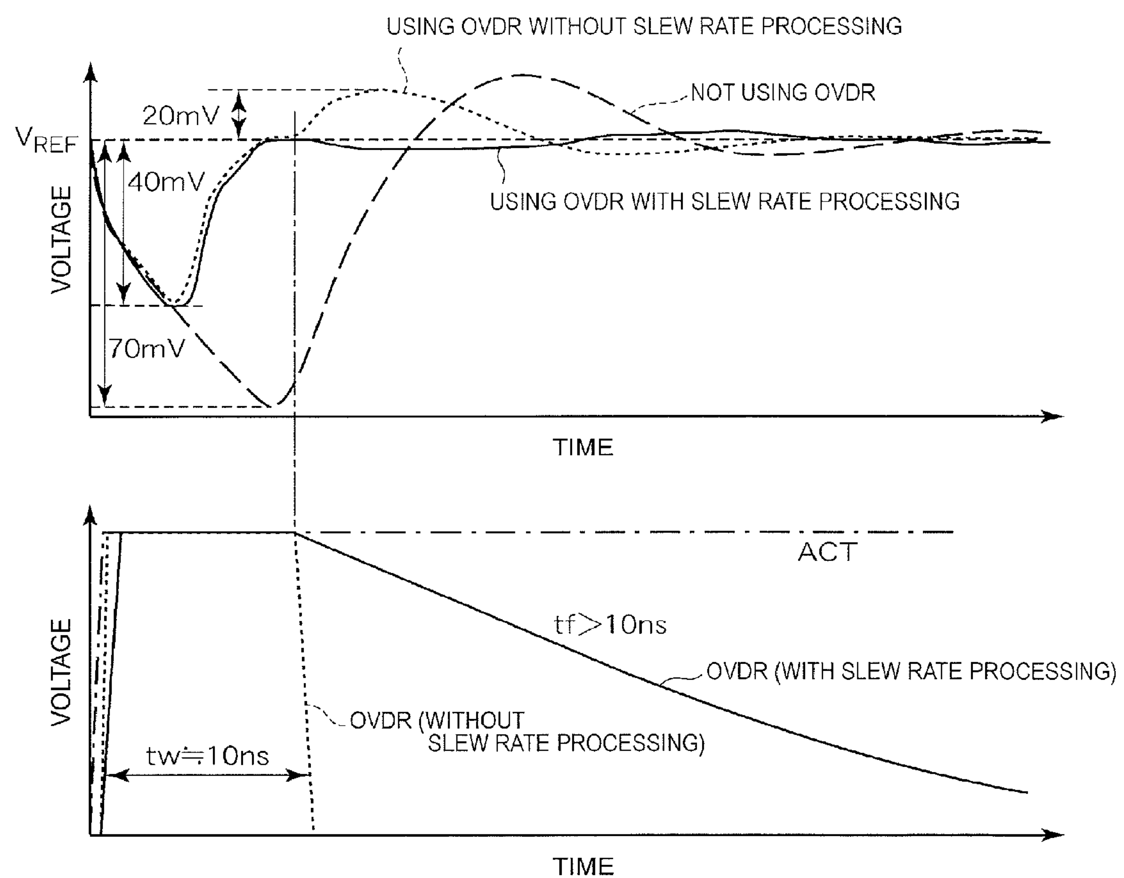
FIG. 7 is a diagram showing a change in the power supply voltage $V_{PERI}$ generated by the $V_{PERI}$ generating circuit according to the preferred first embodiment of the present invention over time, and a diagram showing changes of the active signal ACT and the current control signal OVDR over time.

An upper diagram of FIG. 7 is a diagram showing a change in the power supply voltage $V_{PERI}$ generated by the $V_{PERI}$ generating circuit 2 over time, and a lower diagram thereof is a diagram showing changes of the active signal ACT and the current control signal OVDR over time. In these drawings, the horizontal axes denote time, and the vertical axes denote voltage. In the upper diagram, a case in which the current control signal OVDR is not used (a case in which the second current supplying transistor 64 is not provided), and a case in which the slew rate processing upon the inactivation is not performed are described as comparative examples. In the lower diagram, the current control signal OVDR in the case where the slew rate processing upon an inactivation is not performed is also shown.

As is apparent in the lower diagram of FIG. 7, the slew rate of the current control signal OVDR upon the inactivation is lowered by the processing of the slew rate processing unit 80. A magnitude of the decrease is preferably set such that the time (descending time) tf until the current control signal OVDR returns to low becomes longer than the activation period tw of the one-shot signal P. For example, in a case where the regulator 6 is formed by a minimum process dimension of 45 nm, since the optimal value of the activation period tw becomes 10 nsec, the descending time tf is preferably determined as a value larger than 10 nsec. The setting of the magnitude of the slew rate can be performed by appropriately adjusting the resistance value of the resistive element 86 and the capacitance value of the capacity element 87 as shown in FIG. 5.

As shown in the upper diagram of FIG. 7, in the case of not using the current control signal OVDR, the power supply voltage $V_{PERI}$ drops by about 70 mV just after the activation of the active signal ACT, and thereafter gradually approaches the target voltage $V_{REF}$. After having reached the target voltage $V_{REF}$, it once greatly exceeds the target voltage $V_{REF}$ (overshoots), and then converges to the target voltage $V_{REF}$ gradually while fluctuating.

On the other hand, in the case of using the current control signal OVDR to which the slew rate processing upon the inactivation is not performed, the drop of the power supply voltage $V_{PERI}$ just after the activation of the active signal ACT is suppressed to about 40 mV. Further, an overshoot such as in the case of not using the current control signal OVDR does not occur. However, on the other hand, as shown in the upper diagram in FIG. 7, another overshoot occurs just after the inactivation of the current control signal OVDR is started. After the occurrence of this overshoot, similar to the case of not using the current control signal OVDR, the voltage converges to the target voltage $V_{REF}$ gradually while fluctuating.

By performing the slew rate processing of the slew rate processing unit 80, as shown in the upper diagram in FIG. 7, the overshoot just after the start of the inactivation of the current control signal OVDR is suppressed. This is due to the temporal rise in the drain voltage of the transistors M1, M2 shown in FIG. 4 being suppressed by performing the inactivation of the current control signal OVDR against time. Hereinbelow, a detailed explanation will be given.

The gates of the transistors M1, M2 configure a capacitance, and during when the current control signal OVDR is activated, larger charge is accumulated in this capacitance than in the case where the current control signal OVDR is inactivated. In other words, the gate-source voltage of the transistors M1, M2 becomes larger than in the case where the current control signal OVDR is inactivated. The large gate-source voltages are maintained for a while even after the start of the inactivation of the current control signal OVDR, and during that time, the current flowing in the transistor M2 temporarily becomes larger than the current flowing in the transistor M4. This causes the gate potential of the transistor M5 to rise, and causes the aforementioned overshoot. If the slew rate processing of the slew rate processing unit 80 is performed, since the current flowing in the transistor M4 slowly becomes small, an increase in a difference between the current flowing in the transistor M2 and the current flowing in the transistor M4 is suppressed. Consequently, the overshoot of the power supply voltage $V_{PERI}$ just after the start of the inactivation of the current control signal OVDR is suppressed.

As explained above, according to the semiconductor device 1 of the present embodiment, it becomes possible to suppress the overshoot of the power supply voltage $V_{PERI}$ just after the start of the inactivation of the current control signal OVDR.

Further, by the overshoot being suppressed, an effect can be achieved in which a required time (setting time) from when the active signal ACT is activated until when the power supply voltage $V_{PERI}$ converges to the target voltage $V_{REF}$ is shortened.

Here, in a case where the DLL circuit 4 is used e.g. in a DRAM of a DDR (Double-Data-Rate) 3 type, the setting time needs to be within 24 nsec. If the setting time exceeds 24 nsec, an error occurs in a delayed time in the delay line (not shown) in the DLL circuit 4, and a jitter that cannot be ignored is generated in an output of the DRAM. The setting time may be shortened by enlarging the capacitance of the capacity element in the phase compensating circuit 5, however, in the case of trying to realize the setting time of 24 nsec or less without using the current control signal OVDR, a large capacitance nearing 10 nF will be needed. This means a significant increase in a chip area. Since the usage of a capacity element with such a large capacitance will not be needed by using the current control signal OVDR, the chip area can be reduced. On the other hand, by merely using the current control signal OVDR, although smaller than 10 nF, a capacity element having a certain degree of a large capacitance will nonetheless be needed. According to the semiconductor device 1 of the present embodiment, by performing the slew rate processing by the slew rate processing unit 80, the setting time can further be shortened, thus the capacitance of the capacity element in the phase compensating circuit 5 can further be made small.

Figure 8:
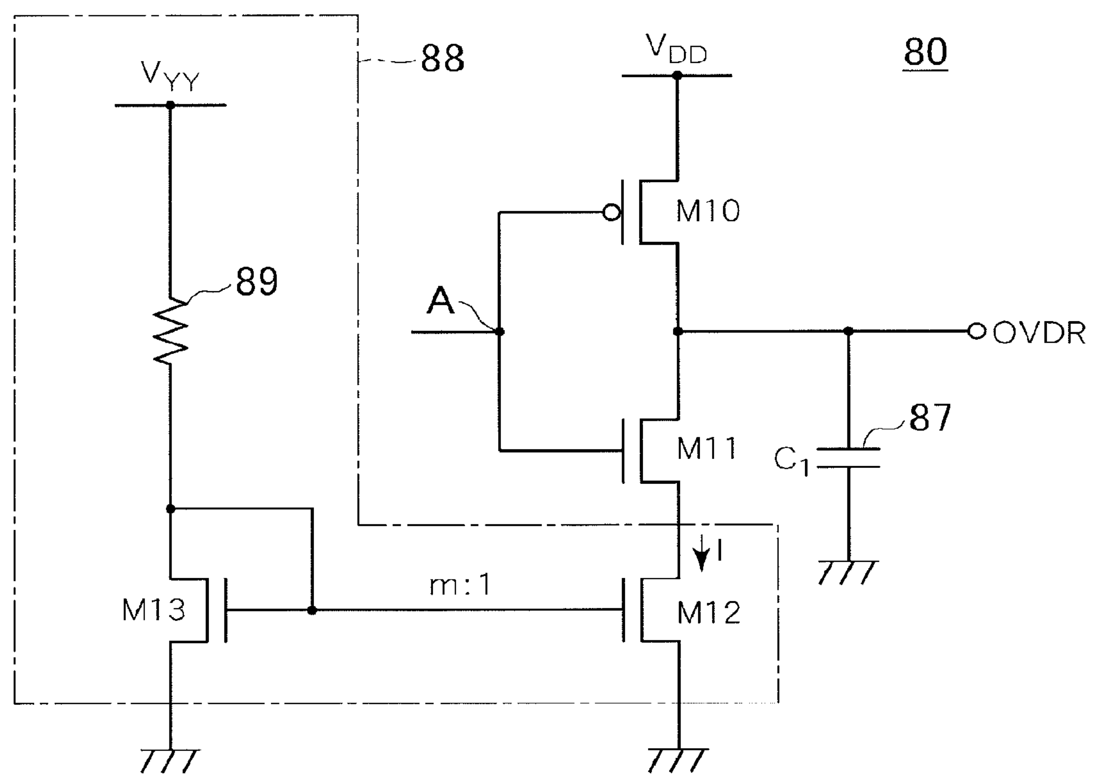
FIG. 8 is a circuit diagram specifically showing an internal configuration of a slew rate processing unit included in a semiconductor device according to a first modification of the first embodiment.

Turning to FIG. 8 the semiconductor device 1 of the present modification differs from the semiconductor device 1 of the first embodiment in that the slew rate processing unit 80 includes a constant current circuit 88 instead of the resistive element 86. Other features are identical to those of the semiconductor device 1 of the first embodiment.

The constant current circuit 88 is configured by including an N-type channel transistor M12 that is connected between a source of a transistor M11 and the ground terminal, an N-type channel transistor M13 connected between a power supply line through which the power supply voltage $V_{YY}$ is supplied and the ground terminal, and a resistive element 89 inserted between the power supply line through which a power supply voltage $V_{YY}$ is supplied and the transistor M13. The power supply voltage $V_{YY}$ is preferably determined as one of the power supply voltage $V_{DD}$ and the power supply voltage $V_{PERI}$. The transistors M12, M13 configure a current mirror, and a ratio (mirror ratio) of a value of a current flowing in the transistor M12 to a value of a current flowing in the transistor M13 is m. According to these configurations, a constant current I flows in the transistor M12. In the slew rate processing unit 80 of the present modification, a discharge of the capacity element 87 is realized by this constant current I. In this case, the aforementioned descending time is $tf=V_{YY}\times C_1/I$. Note that $C_1$ is an electric capacitance of the capacity element 87.

As indicated in the above formula, in the present modification, the discharging time of the capacity element 87 just after the inactivation of the one-shot signal P can be adjusted alternatively by the current value of the constant current I. The adjustment of the current value of the constant current I may be performed either by determining the power supply voltage $V_{YY}$ as the power supply voltage $V_{DD}$ or the power supply voltage $V_{PERI}$, by adjusting the mirror ratio m, or by an adjustment of a resistance value of the resistive element 89.

According to the present modification, even if the resistance value of the resistive element 89 is not so large, the current value of the constant current I can be made small. If the current value of the constant current I is small, compared to the example of FIG. 5, with respect to the capacity element 87, it means that an equivalent discharge time can be secured with a smaller electric capacitance, thus it becomes possible to make an occupying area of the slew rate processing unit 80 in a circuit layout small.

Figure 9:
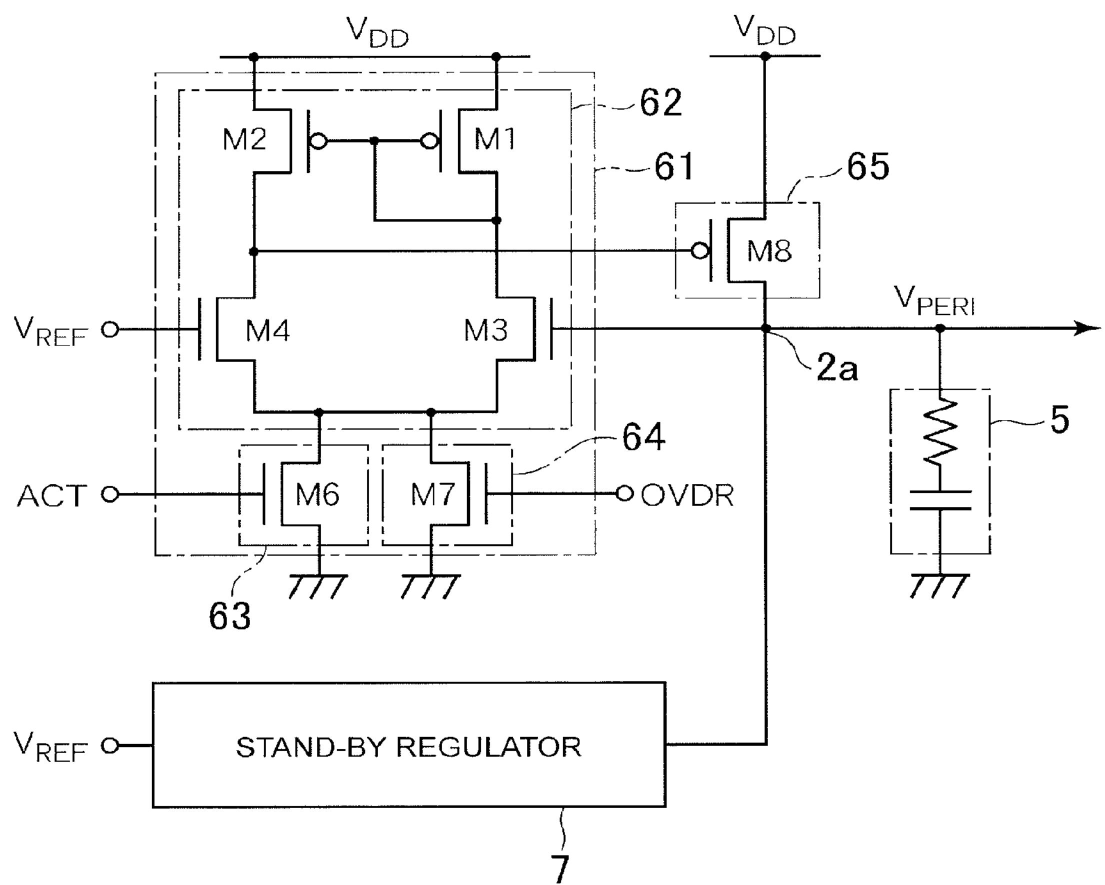
FIG. 9 is a circuit diagram specifically showing internal configurations of the operational amplifier 61 and the driver circuit included in the $V_{PERI}$ generating circuit 2 included in a semiconductor device according to a second modification of the first embodiment.

Turning to FIG. 9, the semiconductor device 1 of the present modification differs from the semiconductor device 1 of the first embodiment in that: the N-type channel transistor M5 is changed to a P-type channel transistor M8; the target voltage $V_{REF}$ is not supplied to the gate of the transistor M3 but to the gate of the transistor M4, and the gate of the transistor M3 is connected to the $V_{PERI}$ output terminal 2*a* instead of the gate of the transistor M4; and the power supply voltage to be supplied to the transistors M1, M2 is changed to the power supply voltage $V_{DD}$ from the power supply voltage $V_{PP}$. In a case where the driver circuit 65 is configured of the P-type channel transistor M8, since the aforementioned problem accompanying the fluctuation in the power supply voltage $V_{DD}$ does not occur, the third feature is configured as above so as to supply the power supply voltage $V_{DD}$ to the transistors M1, M2. Other features are identical to those of the semiconductor device 1 of the first embodiment.

As in the present modification, in the case of configuring the driver circuit 65 with the P-type channel transistor M8, if the processing by the slew rate processing unit 80 is not to be performed, an undershoot (drop from the target voltage $V_{REF}$) occurs in the power supply voltage $V_{PERI}$ just after the start of the inactivation of the current control signal OVDR. This is because in the case where the gate potential of the transistor M6 rises by the same principal as that explained in the first embodiment upon the current control signal OVDR being inactivated, an ON current of the transistor M8 that is the P-type channel decreases contrary to the case of the N-type channel.

According to the present modification, since the current control signal OVDR that is processed by the slew rate processing unit 80 is used, the rise in the gate potential of the transistor M6 just after the start of the inactivation of the current control signal OVDR is suppressed. Consequently, the undershoot of the power supply voltage $V_{PERI}$ as aforementioned is suppressed.

Figure 10:
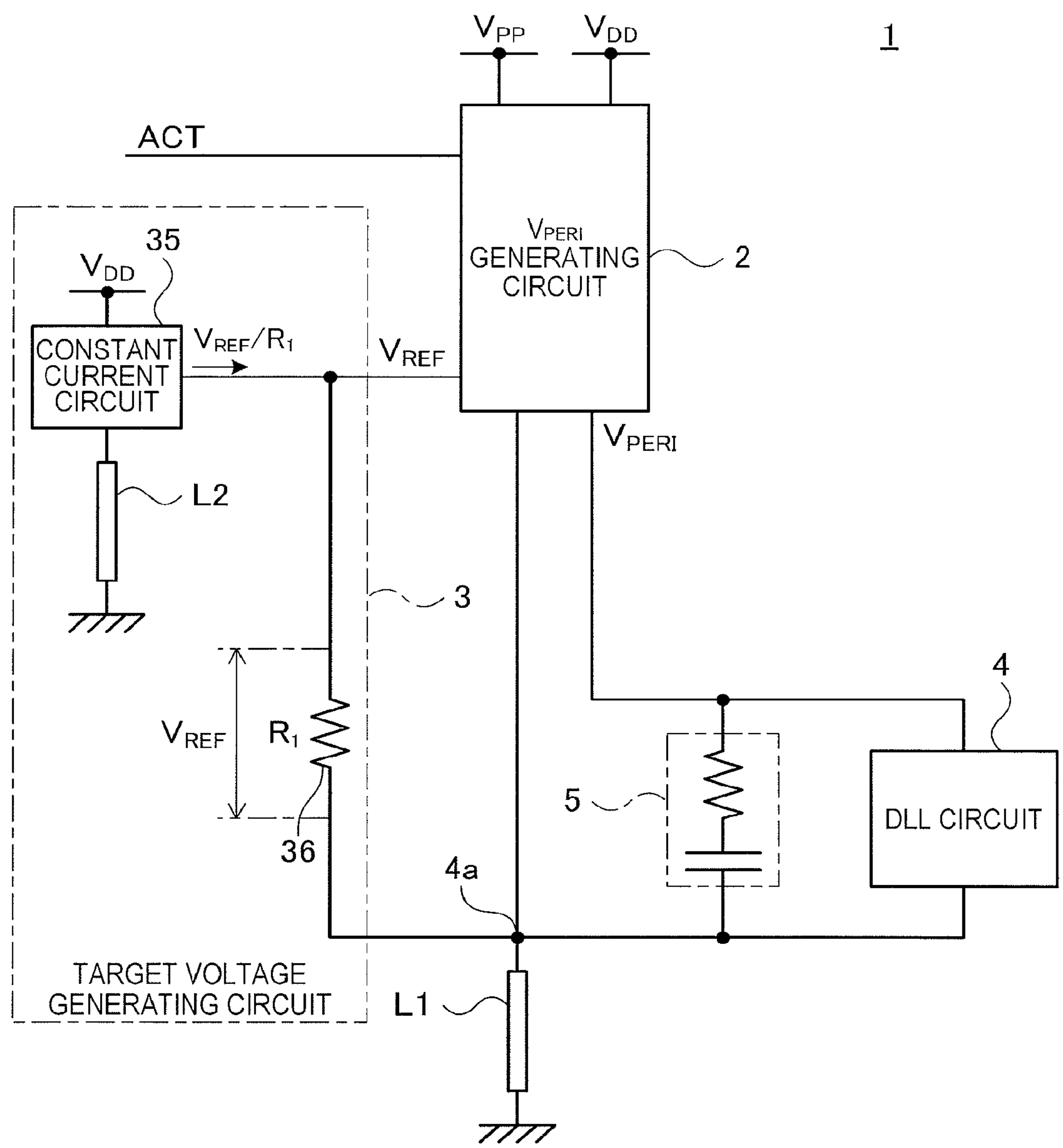
FIG. 10 is a block diagram showing a semiconductor device according to a preferable second embodiment of the present invention.

Turning to FIG. 10, the semiconductor device 1 of the present embodiment differs from the semiconductor device 1 of the first embodiment in that the generation scheme for the target voltage $V_{REF}$ by the target voltage generating circuit 3 is not the voltage generating scheme but is the current generating scheme. Other features are identical to those of the semiconductor device 1 of the first embodiment, thus the same reference signals are given to the same configurational elements, and detailed descriptions thereof are omitted.

As shown in FIG. 10, the semiconductor device 1 of the present embodiment includes the constant current circuit 35 that generates a constant current of a current value $V_{REF}/R_1$, and the resistive element 36 with a resistance value $R_1$ connected between an output of the constant current circuit 35 and the ground terminal, and the target voltage generating circuit 3 is configured by these constant current circuit 35 and resistive element 36. That is, due to the potential of both terminals of the resistive element 36 becoming $V_{REF}$, the voltage input to the $V_{PERI}$ generating circuit 2 as a result becomes equal to $V_{REF}$. The constant current circuit 35 is preferably configured of a band gap reference circuit. By so doing, a noise that occurs in the output current $V_{REF}/R_1$ of the constant current circuit 35 can be significantly decreased.

Here, respective circuits such as the $V_{PERI}$ generating circuit 2, the target voltage generating circuit 3, the DLL circuit 4, etc. according to the present embodiment are formed in a single semiconductor chip. Consequently, the connections thereof are implemented only by wirings within the chip, however, for connections of the respective circuits and the power supply lines, wirings outside the chip such as bonding wires and lead lines of a package are used. Lines L1, L2 shown in FIG. 10 indicate such wirings outside the chip that are present as aforementioned. As shown in the drawing, the constant current circuit 35 and the other circuits are connected via wirings outside the chip that are different from one another to the power supply line to which the ground potential $V_{SS}$ is supplied. By configuring as such, various signals flowing in the other circuits are prevented from being superposed with the constant current output from the constant current circuit 35.

On the other hand, among circuit elements of the target voltage generating circuit 3, the resistive element 36 is connected via the line L1 that is common among the $V_{PERI}$ generating circuit 2 and the DLL circuit 4 to the power supply line to which the ground potential $V_{SS}$ is supplied. By configuring as such, in the semiconductor device 1 of the present embodiment, the operation of the DLL circuit 4 is prevented from becoming unstable due to the noise occurring between the wirings outside the chip to be superposed with the power supply voltage $V_{PERI}$. Hereinbelow, a detailed explanation will be given.

Figure 11A:
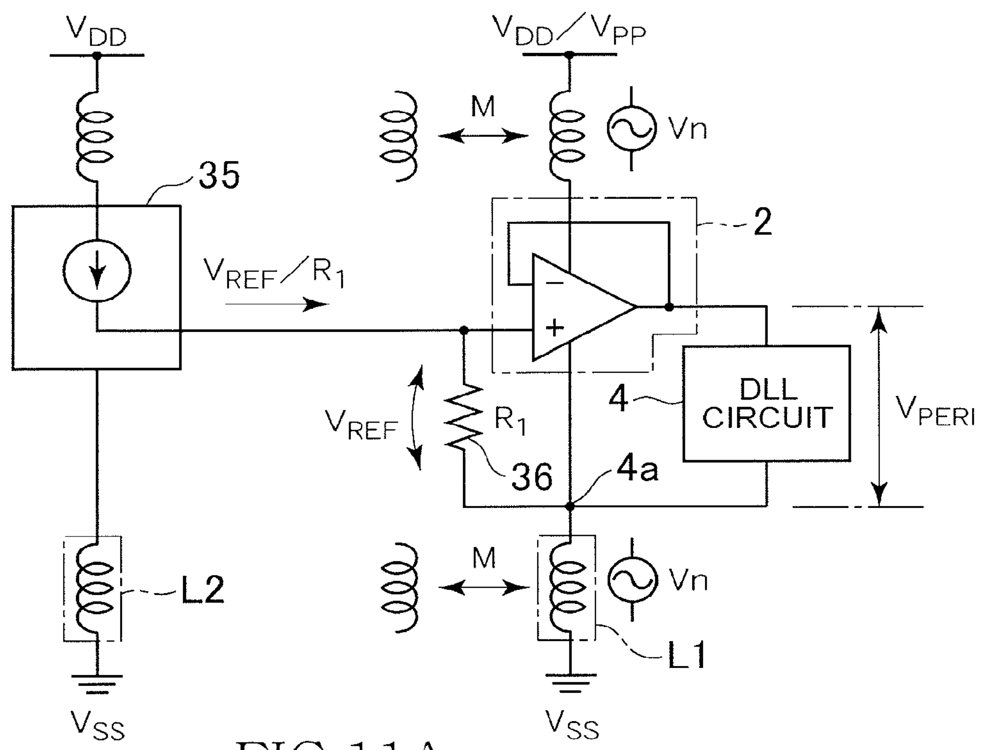
FIG. 11A is a diagram schematically depicting a circuit diagram of the semiconductor device according to the preferable second embodiment of the present invention.
Figure 11B:
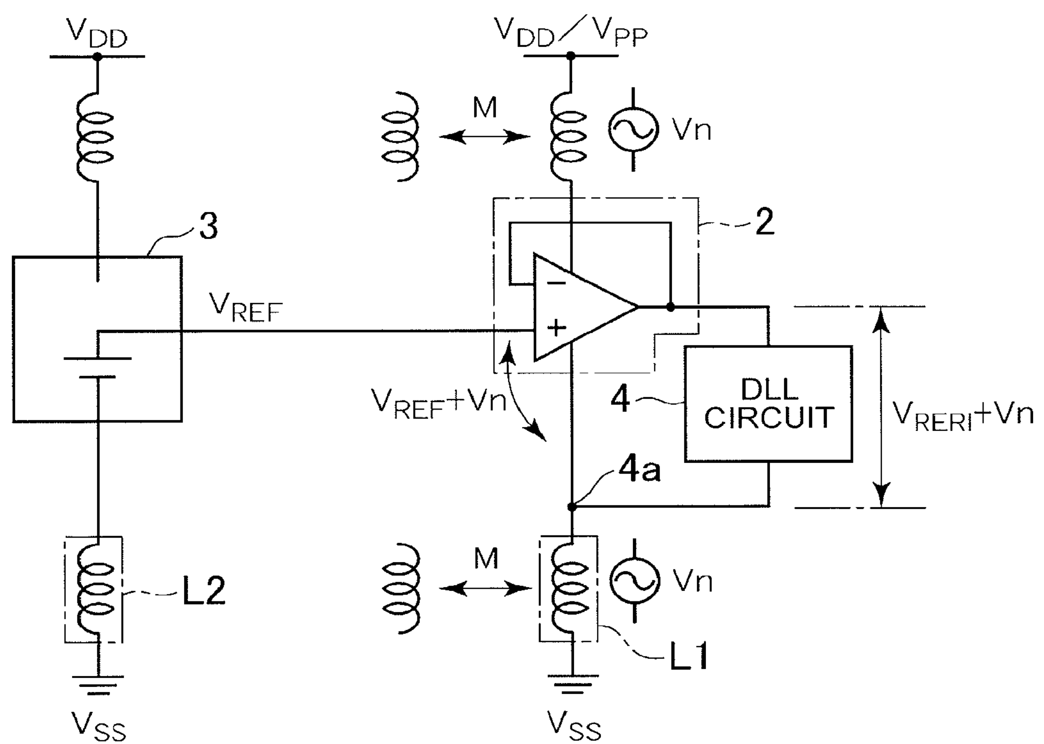
FIG. 11B is a diagram schematically depicting a circuit diagram of the semiconductor device according to the first embodiment of the present invention.

In the example of FIG. 11B, the target voltage generating circuit 3 and the other circuits are connected to the power supply line to which the ground potential $V_{SS}$ is supplied via the lines L1, L2 that are outside the chip, respectively. Further, a node 4*a* shown in FIGS. 11A, 11B is a connecting point of the line inside the chip and the line L1 outside the chip.

As shown in FIGS. 11A, 11B, between the lines outside the chip, a relatively large mutual inductance M is constituted. Since this mutual inductance M generates a noise potential Vn, a potential (reference potential) of the node 4*a* that is to be the reference of the operation of the DLL circuit 4 becomes $V_{SS}'=V_{SS}+Vn$, instead of $V_{SS}$.

In the example of FIG. 11B, the target voltage $V_{REF}$ is generated at irrelevant unit from the line L1. Consequently, the target voltage input to the input terminal of the $V_{PERI}$ generating circuit 2 becomes $V_{REF}+Vn$ as seen from the reference potential $V_{SS}'$. Note that a noise generated in the line L2 is hereby ignored. By the noise potential Vn being superposed with the target voltage $V_{REF}$, as shown in FIG. 11B, the corresponding noise potential Vn is superposed with the power supply voltage $V_{PERI}$ as seen from the reference potential $V_{SS}'$. This becomes a cause of the operation of the DLL circuit 4 becoming unstable.

On the other hand, in the present embodiment shown in FIG. 11A, the target voltage $V_{REF}$ is a potential difference between both terminals of the resistive element 36 connected between the node 4*a* and the input terminal of the $V_{PERI}$ generating circuit 2. Consequently, the target voltage input to the $V_{PERI}$ generating circuit 2 is $V_{REF}$ as seen from the reference potential $V_{SS}'$, and the noise potential Vn is not superposed therewith. Consequently, the noise potential Vn is not superposed with the power supply voltage $V_{PERI}$, and the operation of the DLL circuit 4 is prevented from becoming unstable.

As explained above, according to the semiconductor device 1 of the present embodiment, the operation of the DLL circuit 4 is prevented from becoming unstable due to the noise caused by a coupling of the lines outside the chip being superposed with the power supply voltage $V_{PERI}$.

Figure 12:
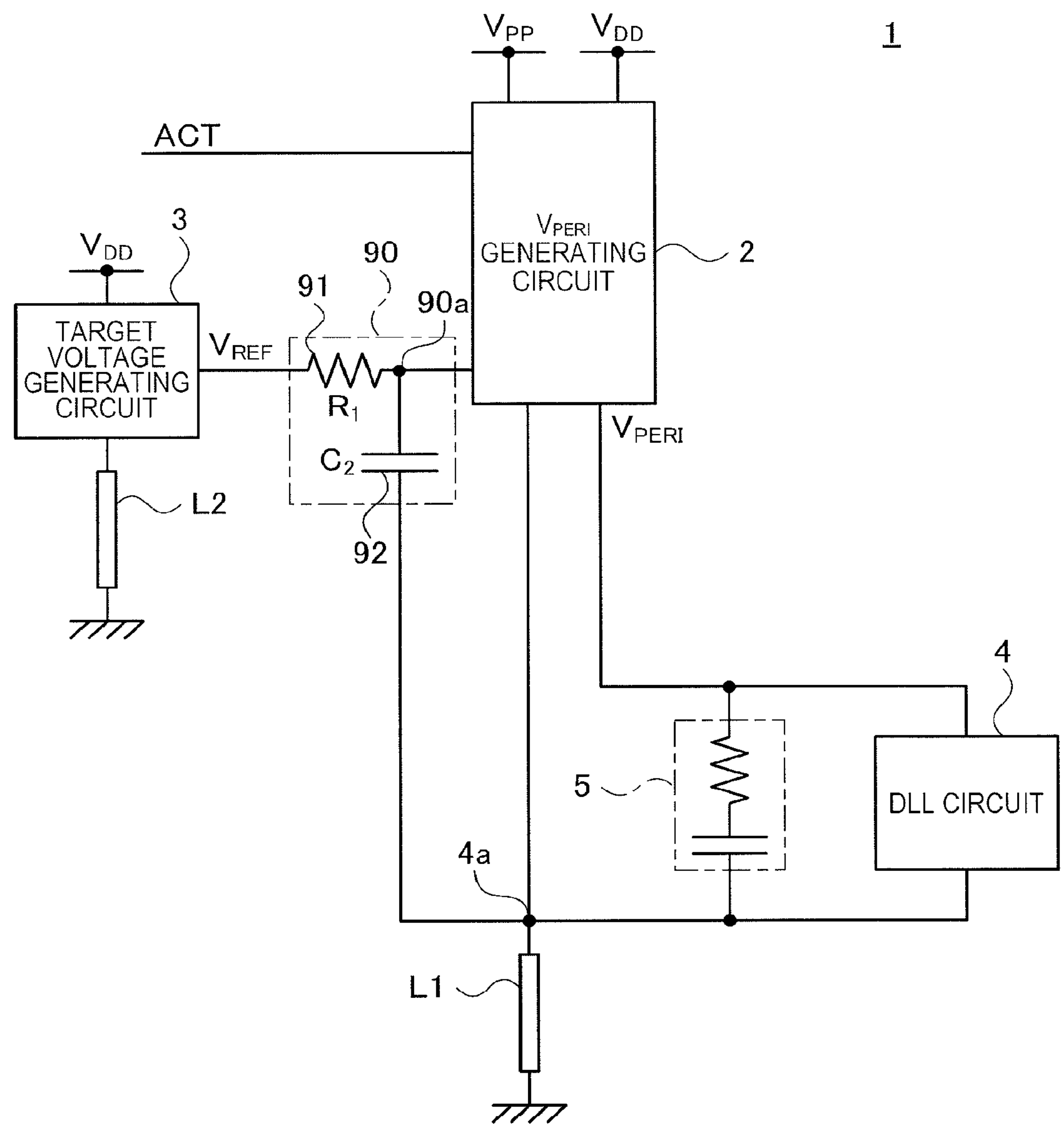
FIG. 12 is a block diagram showing a configuration of a semiconductor device of a third preferable embodiment of the present invention.

Turning to FIG. 12, the semiconductor device 1 of the present embodiment differs from the semiconductor device 1 of the first embodiment in that a low pass filter 90 is inserted between the target voltage generating circuit 3 and the $V_{PERI}$ generating circuit 2. Other features are identical to those of the semiconductor device 1 of the first embodiment, thus the same reference signals are given to the same configurational elements, and detailed descriptions thereof are omitted.

As shown in FIG. 12, the low pass filter 90 is configured of a resistive element 91 having a resistance value $R_1$ inserted in the line connecting the target voltage generating circuit 3 and the $V_{PERI}$ generating circuit 2, and a capacity element 92 having an electric capacitance of $C_2$ and connected between a node 90*a* and the node 4*a*. The node 90*a* locates between the resistive element 91 and the $V_{PERI}$ generating circuit 2. The node 4*a* is a connecting point of the line inside the chip and the line L1 outside the chip as explained in the second embodiment. A cutoff frequency fc of the low pass filter 90 becomes $fc=1/(2\pi C_2R_1)$.

By employing the aforementioned low pass filter 90, in the semiconductor device 1 of the present embodiment, it becomes possible to remove a high frequency noise that is greater than the frequency fc from the target voltage $V_{REF}$. Due to this, the high frequency noise that is greater than the frequency fc is prevented from being superposed with the power supply voltage $V_{PERI}$.

Figure 13:
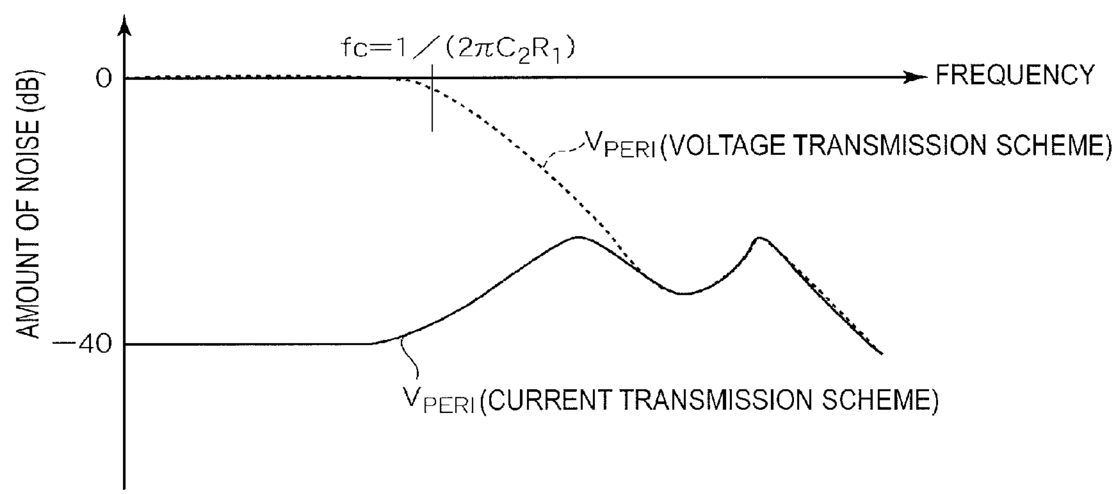
FIG. 13 is a diagram showing a result of a measurement of a frequency property in an amount of noise superposed with the power supply voltage $V_{PERI}$ in the third and a fourth preferable embodiment of the present invention.

Turning to FIG. 13, although the frequency properties in the amounts of noise for both the power supply voltage $V_{PERI}$ generated by using the target voltage $V_{REF}$ by the voltage transmission scheme and the power supply voltage $V_{PERI}$ generated by using the target voltage $V_{REF}$ by the current transmission scheme are shown, the present embodiment focuses on the former. As is apparent from the drawing, in the semiconductor device 1 of the present embodiment, the high frequency noise that is greater than the frequency fc superposed with the power supply voltage $V_{PERI}$ is suppressed.

Figure 14:
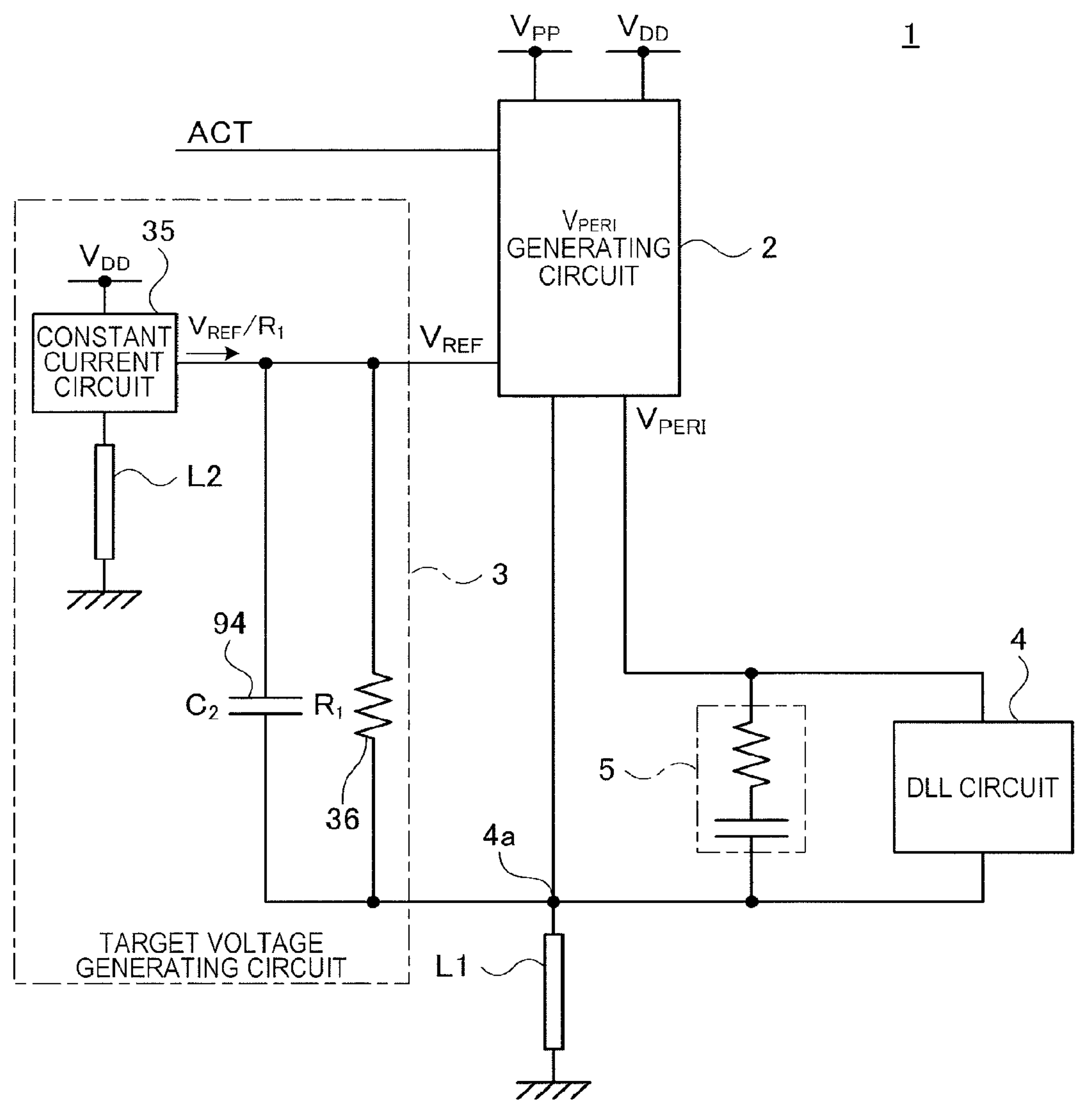
FIG. 14 is a block diagram showing a configuration of the $V_{PERI}$ generating circuit included in the semiconductor device according to the fourth preferable embodiment.

Turning to FIG. 14, the semiconductor device 1 of the present embodiment differs from the semiconductor device 1 of the second embodiment in that the semiconductor device 1 of the present embodiment includes a capacity element 94 having an electric capacitance $C_2$. Other features are identical to those of the semiconductor device 1 of the second embodiment, thus the same reference signals are given to the same configurational elements, and detailed descriptions thereof are omitted.

As shown in FIG. 14, the capacity element 94 is connected in parallel with the resistive element 36. By connecting the capacity element 94 as aforementioned, in the semiconductor device 1 of the present embodiment, the high frequency noise component superposed with the constant current output from the constant current circuit 35 can be suppressed.

In referring to FIG. 13 again, in the case of generating the target voltage $V_{REF}$ by the current transmission scheme, it is understood that noises in a relatively low frequency band are greatly suppressed from the first place. This is not due to the employment of the capacity element 94, but is a property of the current transmission scheme. On the other hand, the current transmission scheme has a feature that a high noise is superposed to the target voltage $V_{REF}$ in a high frequency band compared to the voltage transmission scheme. This is because the constant current circuit 35 includes the band gap reference circuit and an amplifier that converts the voltage generated in the band gap reference circuit to a current, and the response speed of this amplifier is not so fast. In the semiconductor device 1 of the present embodiment, since the high frequency noise generated by such a reason inherent to the current transmission scheme is removed by the capacity element 94, it becomes possible to obtain the same high frequency noise property as the voltage transmission scheme as shown in FIG. 13.

It is apparent that the present invention is not limited to the above embodiments, but may be modified and changed without departing from the scope and spirit of the invention.

The technical concept of the present application may be adapted to an internal voltage generating circuit that generates a positive voltage and a negative voltage. Further, the circuitry configurations in the respective circuit blocks disclosed in the drawings, as well as circuits generating other controlled signals are not limited to the circuitry configurations disclosed in the present embodiments.

The technical concept of the voltage level shift circuit of the present invention may be applied to various semiconductor devices. For example, the present invention may be applied to semiconductor products in general, including functions as CPUs (Central Processing Units), MCUs (Micro Control Units), DSPs (Digital Signal Processors), ASICs (Application Specific Integrated Circuits), ASSPs (Application Specific Standard Products), and memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). The device may even include bipolar transistors.

In addition, an NMOS transistor (N-channel MOS transistor) is a representative example of a first conductive transistor, and a PMOS transistor (P-channel MOS transistor) is a representative example of a second conductive transistor.

Many combinations and selections of various constituent elements disclosed in this specification can be made within the scope of the appended claims of the present invention. That is, it is needles to mention that the present invention embraces the entire disclosure of this specification including the claims, as well as various changes and modifications which can be made by those skilled in the art based on the technical concept of the invention.

What is claimed is:

1. A semiconductor device, comprising:

first to third nodes, the first node being supplied with a first power source and the second node being supplied with a second power source;

a constant current circuit coupled between the first and second nodes and including an output configured to output a current to the third node;

fourth to sixth nodes, the fourth node being supplied with a third power source and the fifth node being supplied with the second power source, the fifth node being separated from the second node;

a voltage generating circuit coupled between the fourth and fifth nodes and including an input coupled to the third node and an output coupled to the sixth node;

a load circuit coupled between the sixth and fifth nodes; and a resister coupled between the third and fifth nodes.

2. The semiconductor device as claimed in claim 1, wherein the constant current circuit, the voltage generating circuit, the load circuit and the resister are provided in a single chip, the semiconductor device further comprises:

a first wiring provided outside the chip and coupled between the second node and a ground line supplied with the second power source; and a second wiring provided outside the chip and coupled between the fifth node and the ground line.

3. The semiconductor device as claimed in claim 2, wherein each of the first and second wirings is a bonding wire.

4. The semiconductor device as claimed in claim 2, wherein each of the first and second wirings is a lead wire.

5. The semiconductor device as claimed in claim 2, wherein the resister has a resistance value, and the current is obtained by dividing a reference voltage by the resistance value, so that the voltage generating circuit receives the reference voltage at the third node.

6. The semiconductor device as claimed in claim 1, the semiconductor device further comprising:

a phase compensating circuit coupled between the sixth and fifth nodes.

7. The semiconductor device as claimed in claim 1, the semiconductor device further comprising:

a capacitor coupled between the third and fifth nodes.

8. The semiconductor device as claimed in claim 1, wherein the voltage generating circuit comprises:

an operational amplifier coupled between the fourth and fifth nodes and including, as the input, a non-inverting input terminal coupled to the third node and an inverting input terminal coupled to the sixth node; and a N-channel MOS transistor coupled between the first and sixth nodes, wherein the first node is supplied with a first voltage potential and the fourth node is supplied with a second voltage potential lower than the first voltage potential.

9. The semiconductor device as claimed in claim 1, wherein the voltage generating circuit comprises:

an operational amplifier coupled between the fourth and fifth nodes and including, as the input, a non-inverting input terminal coupled to the third node and an inverting input terminal coupled to the sixth node; and a P-channel MOS transistor coupled between the first and sixth nodes, wherein each of the first and fourth nodes is supplied with substantially the same voltage potential.

10. The semiconductor device as claimed in claim 1, wherein the a constant current circuit comprises:

a band-gap reference circuit configured to produce a voltage; and an amplifier configured to convert the voltage to the current.

11. The semiconductor device as claimed in claim 1, wherein the first power source is as substantially same as the third power source.

12. The semiconductor device as claimed in claim 1, wherein the first power source is as different from the third power source.

13. The semiconductor device as claimed in claim 12, wherein the first power source is lower than the third power source.

14. A semiconductor device, comprising:

first to third nodes, the first node being supplied with a first power source and the second node being supplied with a second power source;

a reference voltage generator coupled between the first and second nodes and including an output configured to output a reference voltage to the third node;

fourth to sixth nodes, the fourth node being supplied with a third power source and the fifth node being supplied with the second power source, the fifth node being separated from the second node;

a voltage generating circuit coupled between the fourth and fifth nodes and including an input and an output, the output being coupled to the sixth node;

a load circuit coupled between the sixth and fifth nodes; and a filter coupled to the third and fifth nodes and the input of the voltage generating circuit.

15. The semiconductor device as claimed in claim 14, wherein the filter comprises:

a resister coupled between the third node and the input of the voltage generating circuit; and a capacitor coupled between the fifth node and the input of the voltage generating circuit.

16. The semiconductor device as claimed in claim 14, wherein the reference voltage generator, the voltage generating circuit, the load circuit and the filter are provided in a single chip, the semiconductor device further comprises:

a first wiring provided outside the chip and coupled between the second node and a ground line supplied with the second power source; and a second wiring provided outside the chip and coupled between the fifth node and the ground line.

17. The semiconductor device as claimed in claim 14, wherein each of the first and second wirings is a bonding wire or a lead wire.

18. The semiconductor device as claimed in claim 14, the semiconductor device further comprising:

a phase compensating circuit coupled between the sixth and fifth nodes.

19. The semiconductor device as claimed in claim 14, wherein the voltage generating circuit comprises:

an operational amplifier coupled between the fourth and fifth nodes and including, as the input, a non-inverting input terminal coupled to the third node and an inverting input terminal coupled to the sixth node; and a N-channel MOS transistor coupled between the first and sixth nodes, wherein the first node is supplied with a first voltage potential and the fourth node is supplied with a second voltage potential lower than the first voltage potential.

20. The semiconductor device as claimed in claim 14, wherein the voltage generating circuit comprises:

an operational amplifier coupled between the fourth and fifth nodes and including, as the input, a non-inverting input terminal coupled to the third node and an inverting input terminal coupled to the sixth node; and a P-channel MOS transistor coupled between the first and sixth nodes, wherein each of the first and fourth nodes is supplied with substantially the same voltage potential.

* * * * *